United States Patent [19]
Nakata et al.

[11] Patent Number: 5,214,296
[45] Date of Patent: May 25, 1993

[54] THIN-FILM SEMICONDUCTOR DEVICE AND METHOD OF FABRICATING THE SAME

[75] Inventors: Yoshiro Nakata, Ikoma; Naoto Matsuo, Ibaraki; Toshiki Yabu; Susumu Matsumoto, both of Hirakata; Shozo Okada, Kobe, all of Japan

[73] Assignee: Matsushita Electric Industrial Co., Ltd., Osaka, Japan

[21] Appl. No.: 848,840

[22] Filed: Mar. 10, 1992

[30] Foreign Application Priority Data

Mar. 11, 1991 [JP] Japan .................................. 3-044787

[51] Int. Cl.[5] ..................... H01L 29/68; H01L 29/10; H01L 21/01
[52] U.S. Cl. ..................................... 257/71; 257/302; 257/303; 257/304; 257/308; 257/403
[58] Field of Search .................. 257/66, 71, 296, 302, 257/303, 304, 307, 308, 350, 403

[56] References Cited

U.S. PATENT DOCUMENTS

| | | | |
|---|---|---|---|
| 4,673,962 | 6/1987 | Chatterjae et al. | 257/302 |
| 4,713,678 | 12/1987 | Womack et al. | 257/304 |
| 4,974,060 | 11/1990 | Oshsawara | 257/296 |
| 5,016,070 | 5/1991 | Sundaresan | 257/302 |

OTHER PUBLICATIONS

"A Surrounding Gate transfer (SCT) cell for 64/256 Mbit Drams", by K. Sunouchi et al. pp. 23-26, (1989) 1989 IEEE, IEDM 89.

"3-Dimensional Stacked Capacitor Cell for 16m and 64m Drams" by T. Emu et al. pp. 592-595 (1988) 1988 IEEE, IEDM88.

Primary Examiner—Andrew J. James
Assistant Examiner—Ngan Ngo
Attorney, Agent, or Firm—Ratner & Prestia

[57] ABSTRACT

A thin-film semiconductor device having a vertical TFT which includes a gate insulating film formed on a sidewall of a throughhole formed in an insulating layer; a thin-film semiconductor layer formed on the gate insulating film; and a gate electrode formed within the insulating layer. The gate electrode, the gate insulating film, and the thin-film semiconductor layer together form a lateral MOS structure. The thin-film semiconductor layer is connected to a bit line at the bottom of the throughhole and to a storage node of a capacitor formed over the switching transistor.

8 Claims, 5 Drawing Sheets

THIN-FILM SEMICONDUCTOR DEVICE AND METHOD OF FABRICATING THE SAME

BACKGROUND OF THE INVENTION

1. Field of the Invention

This invention relates to a thin-film semiconductor device and a method of fabricating the same. More particularly, the invention relates to a thin-film semiconductor device comprising memory cells each consisting of a capacitor and a switching transistor connected to the capacitor, wherein the switching transistor is a thin-film transistor (hereinafter abbreviated as TFT); and, to a method of fabricating such a thin-film semiconductor device.

2. Description of the Prior Art

In recent years, the capacity of memory that can be stored on a single chip of semiconductor has been increasing by a factor of four approximately every three years, and the memory cell size has been shrinking. However, as for the basic memory cell structure in dynamic random access memories (DRAMs), the same one-transistor and one-capacitor configuration initially employed in 4-kilobit DRAMs has been in use over eight generations, and are currently used in 64-megabit DRAMs. In the meantime, the capacitor structure has been changed from a planar type to a trench type and to a stacked type. The type of insulating film has also been changed from the initial silicon oxide film to the most recent ONO (silicon oxide-nitride-oxide) film. With respect to the switching transistor, however, the only way to cope with the miniaturization of memory cells has been to reduce the size of the MOSFET whose channel is formed in a singlecrystalline substrate.

An example of the above prior art semiconductor device will now be described with reference to the accompanying drawing. FIG. 5 shows a cross sectional view of a memory cell in a prior art stacked capacitor type DRAM. As shown in FIG. 5, the capacitor comprises charge storage electrodes (storage nodes) 31a and 31b, a fixed potential application electrode (cell plate) 32, and a dielectric film 33 sandwiched between the electrodes 31a, 31b, and 32. Charge is stored on the capacitor. A switching MOSFET 34 comprises such elements as an impurity diffusion regions (source/drain regions) 37 formed at the surface of an semiconductor substrate 80 and a word line 35 that acts as the gate electrode of the switching MOSFET 34. The word line 35 is covered with silicon oxide film 82. The switching MOSFET 34 and the capacitor are covered with a silicon oxide film 83. A bit line 36 for charging the capacitor is formed on the silicon oxide film 83 so as to contact one of the impurity diffusion regions 37.

In the above configured semiconductor device, the switching MOSFET 34 is turned on by applying a voltage to the gate electrode 35 thereof, which in turn causes charges stored in the storage nodes 31a, 31b to flow through the impurity diffusion regions 37 and a channel region of the switching MOSFET 34 to the bit line 36, thereby enabling the information to be written into and read out of the capacitor. (See, for example, T. Ema et at., "3-Dimensional Stacked Capacitor Cell for 16M and 64M DRAMs", IEDM Dig. of Tech. Papers (1988), p.592.)

Another three-dimensional transistor structure designed for higher packing density is a surrounding gate transistor (SGT) such as is shown in FIGS. 7A and 7B. In the SGT, a word line 35 and a cell plate electrode 32 are wound around a silicon pillar 71 (formed by etching a surface of a silicon substrate 80), thereby forming a vertical transistor 34 and a capacitor. The capacitor comprises a storage node 37b formed in the surface region of the silicon pillar 71, a dielectric film 33 formed on the storage node 37b, and the cell plate electrode 32 formed on the storage node 37b. (See, for example, K. Sunouchi et at., "A Surrounding Gate Transistor (SGT) Cell for 64/256 Mbit DRAMs", IEDM Dig. of Tech. Papers (1989), pp.23-26.) As is shown in FIGS. 7A and 7B, a bit line 36 is connected to an impurity diffusion region 37a at the upper end of the silicon pillar 71. According to the above configuration, the gate length of the switching MOSFET 34 can be determined by the height of the silicon pillar 71, independently of device miniaturization in lateral directions.

In terms of integration, one cell requires one word line, a ½ bit line, one storage electrode contact, and a ½ bit line contact; the areas of these elements plus the process margins determine the minimum cell size. Therefore, for further miniaturization, these areas must be further reduced. For cell miniaturization, it is also necessary to reduce the gate length of the switching MOSFET, that is, the word line width. This dimension cannot be determined by miniature processing techniques alone, but degradation in characteristics such as channel leakage currents and hot carriers must also be taken into consideration to determine this dimension.

In the above mentioned configuration of FIG. 5, the storage electrodes are coupled to the impurity diffusion regions 37 formed at the substrate surface and the substrate 80 is usually held at a negative potential of −2 to −3 Volts to prevent the substrate from becoming unstable due to the pulse operation of the transistor. As a result, there is a problem in that the junction leakage increases and occupies a dominant proportion in the total leakage of the cell capacitor, the junction leakage thus determining the retention characteristic of the capacitor. The prior art semiconductor device has the further problem that the minority carriers dissociated because of the alpha particles injected into the substrate 80 are collected by the storage electrodes 31a and 31b, thereby causing the capacitor to discharge and resulting in soft errors.

In the surrounding gate transistor (SGT) illustrated in FIGS. 7A and 7B, since the bit line contact can be formed on the upper end (the impurity diffusion region 37a) of the silicon pillar 71, there is no such problem as is described above in terms of integration. However, this structure cannot be used for a stacked capacitor cell. Furthermore, since the impurity diffusion region in the substrate is also used as the storage node 37b, the junction leakage and alpha particles present greater problems than in the case of the stacked capacity cell shown in FIG. 5.

SUMMARY OF THE INVENTION

The thin-film semiconductor device of the present invention overcomes the above-discussed and numerous other disadvantages and deficiencies of the prior art. The thin-film semiconductor device has a plurality of switching transistors, and comprises a first insulating layer, a first conductive layer formed on the first insulating layer, a second insulating layer formed on the first insulating layer so as to cover the first conductive layer, a third insulating layer formed on the second insulating layer, a plurality of throughholes formed in the second and third insulating layers, each of the throughholes reaching the first conductive layer, and a second conductive layer formed on the third insulating layer; each of the switching transistors comprising a gate insulating film formed on the sidewall of each of the throughholes, a thin-film semiconductor channel layer formed on the gate insulating film, the thin-film semiconductor channel layer interconnecting the first conductive layer to the second conductive layer, and a gate electrode formed on the second insulating layer, the gate electrode surrounding the gate insulating film.

In a preferred embodiment, both the thin-film semiconductor channel layer and the second conductive layer are made of a polycrystalline silicon film.

In a preferred embodiment, the device is a semiconductor memory device having a plurality of memory cells, each of the memory cells comprising one of the switching transistors and a storage capacitor, the storage capacitor comprising a storage node which includes a portion of the second conductive layer.

In a preferred embodiment, the device comprises a plurality of bit lines for charging the storage node, the bit lines being made of the first conductive layer.

According to another aspect of the invention, a thin-film semiconductor device having a switching transistor is provided, the thin-film semiconductor device comprising a semiconductor substrate, a first insulating layer formed on the semiconductor substrate, a second insulating layer formed on the first insulating layer, a plurality of throughholes formed in the first and second insulating layers, each of the throughholes reaching an inner portion of the semiconductor substrate, a third insulating film formed on the second insulating film and side wall of each of the throughholes, and a conductive layer formed on the third insulating film; the switching transistor comprising a gate insulating film formed on the sidewall of each of the throughholes, the gate insulating film being made of a portion of the third insulating film, a thin-film semiconductor channel layer formed on the gate insulating film, the thin-film semiconductor channel layer being made of a first portion of the conductive layer, and a gate electrode formed on the first insulating layer, the gate electrode surrounding the gate insulating film.

In a preferred embodiment, both the thin-film semiconductor channel layer and the conductive layer are made of a polycrystalline silicon film.

In a preferred embodiment, the device is a semiconductor memory device having a plurality of memory cells, each of the memory cells comprising one of the switching transistors and a storage capacitor, the storage capacitor including a storage node which is a second portion of the conductive layer, the second portion being at the inner portion of the semiconductor substrate.

In a preferred embodiment, the device comprises a plurality of bit lines for charging the storage node, the bit lines being made of a third portion of the conductive layer.

According to yet another aspect of the invention, a method of fabricating a thin-film semiconductor device is provided, the method including the steps of forming a first conductive layer on a first insulating layer, forming a second insulating layer on the first insulating layer so as to cover the first conductive layer, forming gate electrodes on the second insulating layer, forming a third insulating layer on the second insulating layer so as to cover the gate electrodes, forming a plurality of throughholes in the second and third insulating layers, the throughholes penetrating the gate electrode and reaching the first conductive layer, forming a gate insulating film on a sidewall of each of the throughholes, and forming a second conductive layer on the third insulating layer so as to contact the first conductive layer at the bottoms of the throughholes.

Thus, the invention described herein makes possible the objectives of (1) providing a thin-film semiconductor device suitable for device miniaturization; (2) providing a thin-film semiconductor device in which a storage node of a capacitor and a bit line are not electrically connected to an impurity diffusion region formed in a semiconductor substrate; (3) providing a thin-film semiconductor device which is free from soft errors due to alpha particles; and (4) providing a method of fabricating such a thin-film semicondutor device.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

A thin-film semiconductor device of the present invention will now be described with reference to FIGS. 1 and 2. The thin-film semiconductor device of this embodiment is a dynamic RAM (DRAM) having a plurality of memory cells each consisting of a capacitor and a switching transistor connected to the capacitor. One of features of this embodiment is that a switching transistor 4 in the memory cell is a vertical TFT, as hereinafter described in detail.

Figure 1:
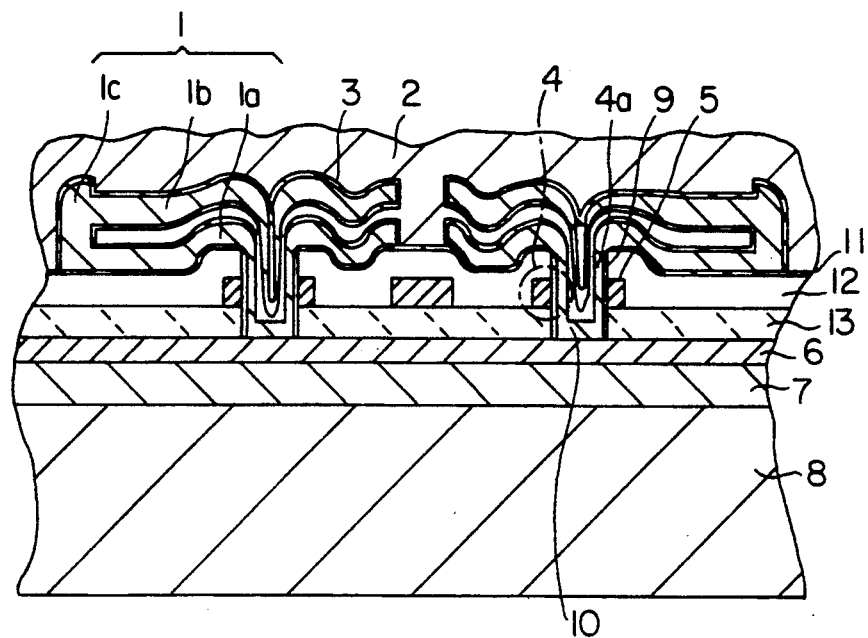
FIG. 1 is a cross-sectional view of a thin-film semiconductor device according to the present invention.
Figure 2:
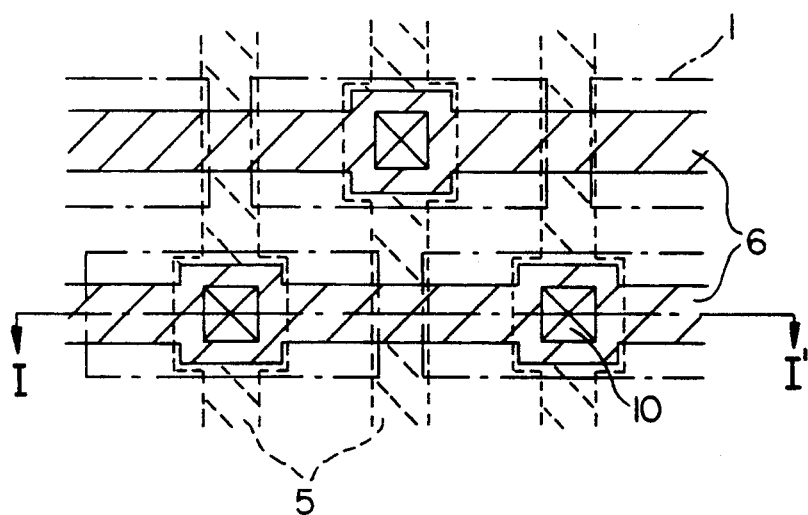
FIG. 2 is a planar layout of the thin-film semiconductor device according to the present invention.

As is shown in FIG. 1, the thin-film semiconductor device comprises a semiconductor substrate (singlecrystalline silicon substrate) 8, a LOCOS oxide film (a first insulating layer) 7, a plurality of bit lines (shown as a single conductive layer for simplicity) 6 formed on the oxide film 7, and a silicon oxide film 13 (a second insulating layer) formed on the LOCOS oxide film 7 so as to cover the bit lines 6. A multi-layer film (a third insulating layer) composed of a silicon oxide film 12 and a silicon nitride film 11 is formed on the silicon oxide film 13, in such order. The silicon nitride film 11, the silicon oxide film 12, the word lines 5, and the oxide film 13 contain a plurality of throughholes 10 reaching the bit lines 6.

The switching transistor 4 of this embodiment includes a gate insulating film (sidewall insulating layer) 9 formed on the sidewall of the throughhole 10, a thin-film semiconductor layer 4a formed on the gate insulating film 9, and a word line (gate electrode) 5 formed inside the silicon oxide film 12. The word line 5, the gate insulating film 9, and the thin-film semiconductor layer 4a together form a lateral MOS structure (parallel to the principal plane of the semiconductor substrate). As is shown in FIG. 2, each throughhole 10 is formed penetrating the word line 5 at a prescribed area thereof. The inside diameter of the throughhole 10 is approximately 0.4 μm. The area of the word line 5 through which the throughhole 10 is made measures approximately 0.7 μm×0.7 μm.

The capacitor formed above the silicon oxide film 12 includes a storage node 1 (a second conductive layer), a dielectric film 3 formed on the surface of the storage node 1, and a cell plate 2 formed facing the storage node 1 and separated by the dielectric film 3. An n-type doped polysilicon film 1a forming part of the storage node 1 is formed integrally with the thin-film semiconductor layer 4a of the switching transistor 4. In other words, the storage node 1a and the thin-film semiconductor layer 4a are formed from the same polysilicon film (a second conductive layer). The dielectric film 3 is a silicon oxide-nitride-oxide film (ONO film).

The DRAM of this embodiment has a large number of memory cells formed on the LOCOS oxide film 7. Transistors forming peripheral circuitry (not shown) connected to an array of memory cells (memory cell array) are formed at the surface of the semiconductor substrate 8. In this embodiment, the region where the memory cell array is formed and the region where the peripheral circuitry is formed are separated from each other in terms of plan layout. However, in an alternative preferred embodiment, in order to increase the packing density, these regions may be arranged overlapping each other in terms of plan layout.

Figure 6A:
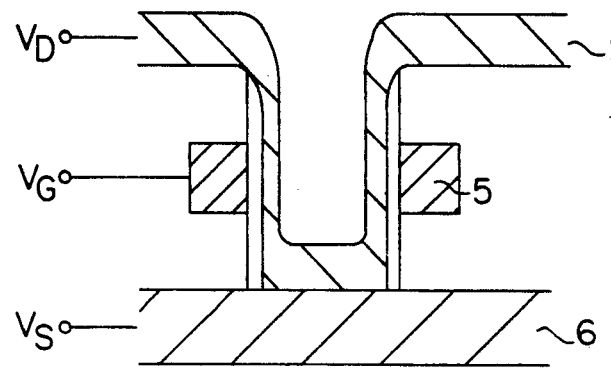
FIG. 6A is a cross-sectional view illustrating a switching transistor in the thin-film semiconductor device shown in FIG. 1.
Figure 6B:
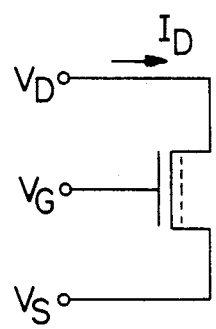
FIG. 6B is an equivalent circuit of the switching transistor.
Figure 6C:
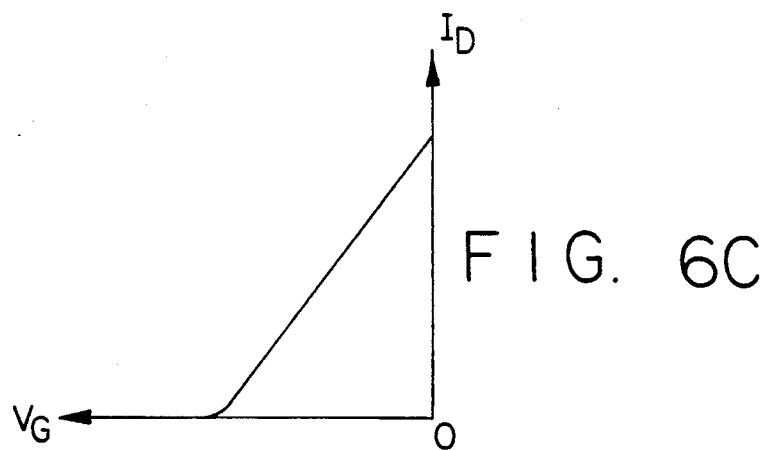
FIG. 6C is a graph showing a relationship between a drain current and a gate potential.
Figures 7A, 7B:
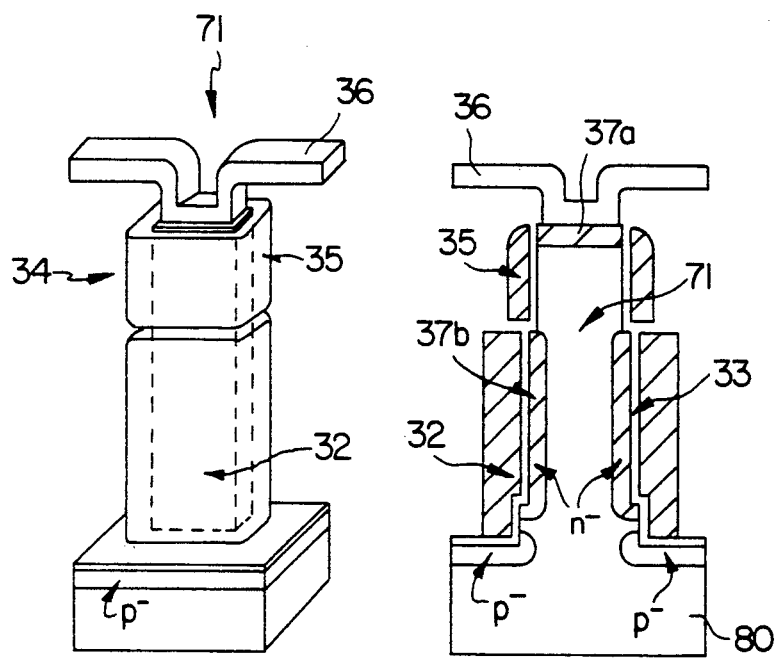
FIG. 7A is a perspective view of another prior art thin-film semiconductor device.
FIG. 7B is a cross-sectional view of the prior art thin-film semiconductor device.

Referring to FIG. 6A, the operation of the switching transistor 4 will now be described. A drain voltage VD, a gate voltage VG, and a source voltage VS are applied to the storage node 1a, the word line 5, and the bit line 6, respectively. FIG. 6B shows the equivalent circuit of the transistor of FIG. 6A. FIG. 6C shows the gate voltage-drain current characteristic (VG-ID characteristic) of this transistor. When a negative voltage as the gate voltage VG is gradually applied while maintaining the drain voltage constant, the channel region in the thin-film semiconductor layer 4a gradually becomes depleted. As a result, the drain current ID gradually decreases as shown in FIG. 6C. When the channel region in the thin-film semiconductor layer 4a becomes completely depleted, the drain current ID becomes zero. The switching transistor of this embodiment is a TFT and is thus sufficiently capable of functioning as a switching transistor for the memory cell.

According to the invention, a voltage is applied to the gate electrode formed on a portion of the outside wall of the throughhole so as to control the carrier density in the thin-film semiconductor channel layer, which is formed contacting the gate insulating layer on a portion of the inside wall of the throughhole, thus controlling the conductivity of the thin-film semiconductor channel layer.

In general, the leakage currents from the storage node that have heretofore been presenting problems can be divided into leakage currents from the storage node to the plate electrode (dielectric film leakage); leakage currents from the storage node to the semiconductor substrate (junction leakage); and leakage currents from the storage node to the bit line (leakage during the off state of the switching transistor).

When the dielectric film is formed from an ONO film (oxide film equivalent thickness of 5 nm) and the difference between the plate voltage and the maximum storage node voltage is approximately 2 volts, the dielectric film leakage per memory cell is somewhere around 0.1 to 0.3 femto farad (fF). By comparison, the junction leakage is usually an order of one greater than that. On the other hand, the switching transistor off leakage is of the magnitude that can be disregarded as compared with the above leakage values. If the junction leakage is reduced virtually to zero, the data retention time will increase on the order of one.

According to the embodiment, the thin-film semiconductor layer 4a formed on the inside wall of the throughhole 10 simultaneously with the formation of the storage node 1a acts as the channel layer of the switching transistor, TFT 4, in the memory cell, and the storage node 1 is electrically completely isolated from the semiconductor substrate 8. With this structure, there is no possibility that the charge stored in the storage node 1 of the capacitor will leak into the semiconductor substrate 8 through a p-n junction formed in the semiconductor substrate 8.

Also, the thin-film semiconductor device of this embodiment is less susceptible to soft errors caused by alpha particles. Normally, in a 64-megabit semiconductor memory, the absorption of an alpha particle can cause the loss of charge up to about 20 fF stored at the junctions with the semiconductor substrate, which is approximately equal to the amount of charge stored in 100 memory cells when converted to dielectric film leakage (100=20 femto coulomb/1.6 femto ampere). In terms of cell capacitance, this amounts to 12 fF when the write voltage is 1.65 volts (12 fF=20 femto coulomb/1.65 volts). According to the structure of this embodiment, the data retention time can be increased without having to increase the memory cell capacitance in order to prevent soft errors caused by alpha particles.

Furthermore, since the switching transistor 4 is formed from a vertical TFT, the gate length of the TFT 4 is determined by the thickness of the word line 5 and the gate width is determined by the inner circumferential length of the throughhole 10. As a result, according to the thin-film semiconductor device of the present embodiment, a size reduction in the lateral direction or an increase in the packing density can be achieved more easily than the prior art semiconductor device wherein the switching transistor is formed from a lateral transistor.

Figure 3A:
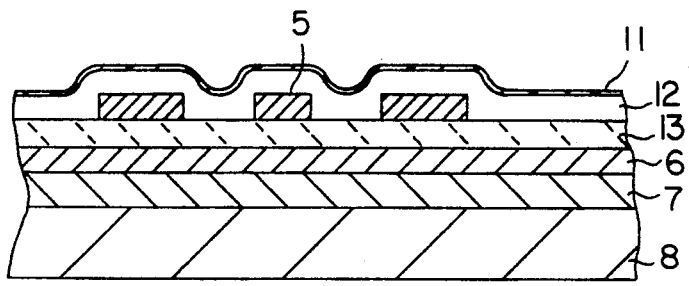
FIGS. 3A through 3D are cross-sectional views illustrating processes of fabricating the thin-film semiconductor device shown in FIG. 1.

Referring now to FIGS. 3A through 3D, we will describe a method of fabricating the thin-film semiconductor device of this embodiment. Referring initially to FIG. 3A, first a LOCOS oxide film (a first insulating layer) 7 is selectively formed on a prescribed region of the surface of a semiconductor substrate 8. In the embodiment, the LOCOS oxide film 7 covers a memory cell array region of the semiconductor substrate 8. On the surface of the semiconductor substrate 8 which is not covered by the LOCOS oxide film 7, transistors constituting peripheral circuitry are formed by conventional techniques. Next, a $WSi_{2.7}$ film of 250 nm thickness, a film of a refractory material, is deposited over the LOCOS oxide film 7, and the $WSi_{2.7}$ film is patterned by photolithography to form a plurality of bit lines (a first conductive layer) 6. An oxide film 13 (a second insulating layer) of 250 nm thickness is formed on the LOCOS oxide film 7 in such a manner as to cover the bit lines 6. The oxide film 13 acts as an interlayer insulating film. Thereafter, a polysilicon film of 700 nm thickness is deposited over the oxide film 13 and is patterned by photolithography to form a plurality of word lines 5. The word lines 5 are formed intersecting the bit lines 6 underneath.

Next, a silicon oxide film (thickness 300 nm) 12 and a silicon nitride film (thickness 50 nm) 11 are deposited on top of the oxide film 13 in such a manner as to cover the word lines 5. Thereafter, a resist film having openings at intersections between the word lines 5 and the bit lines 6 is formed photolithographically on the silicon nitride film 11, after which the silicon nitride film 11, the silicon oxide film 12, the word lines 5, and the oxide film 13 are anisotropically etched in the order stated, thereby forming throughholes 10 reaching the bit lines 6. In this embodiment, a multilayer film composing of the silicon nitride film 11 and the silicon oxide film 12 serves as a third insulating layer. The throughholes 10 are formed penetrating the word lines 5, each word line 5 being exposed on the sidewall of each throughhole 10. The inside diameter of each throughhole 10 is about 0.4 $\mu$m. The area of each word line 5 through which the throughhole 10 is made measures approximately $0.7 \times 0.7$ $\mu$m.

Figure 3B:
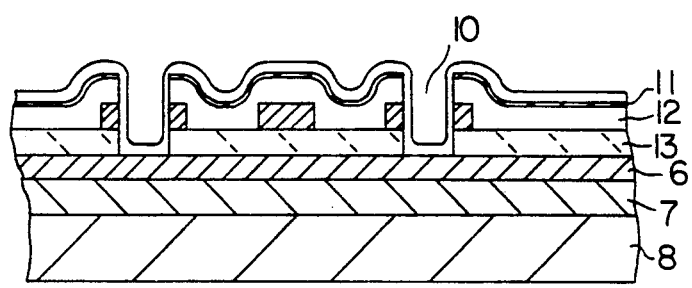

After removing the resist film, an HTO film (a silicon oxide film deposited at a relatively high temperature) of 50 nm thickness is formed over the entire surface of the silicon nitride film 11 and the inside surfaces of the throughholes 10 as is shown in FIG. 3B. Using an anisotropic etching technique, the HTO film is etched to a depth just equal to its thickness. As a result of the anisotropic etching, the HTO film is left only on the sidewalls of the throughholes 10, thus forming a gate insulating film (sidewall insulating film) 9 formed from the HTO film. The portions of each word line 5 exposed inside each throughhole 10 are now completely covered by the gate insulating film 9.

Figure 3C:
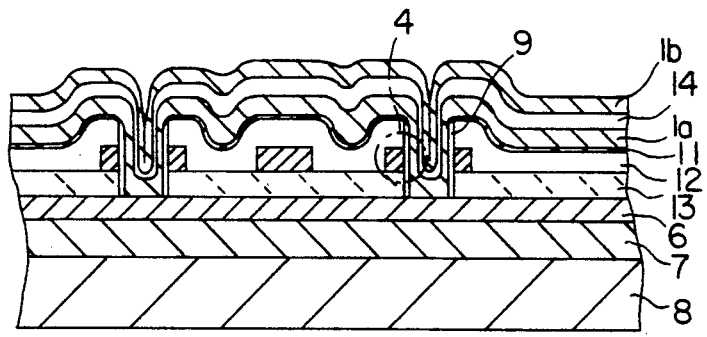

Next, using a CVD process, an n-type doped polysilicon film (a second conductive layer) 1a is deposited as is illustrated in FIG. 3C. The deposition conditions are controlled so that the n-type doped polysilicon film 1a is grown to a thickness of 100 nm on flat surfaces and to a thickness of about 50 nm on the inside of each throughhole 10. The portion of the n-type doped polysilicon film 1a grown on the inside of each throughhole 10 acts as a thin-film semiconductor layer 4a.

Figure 3D:
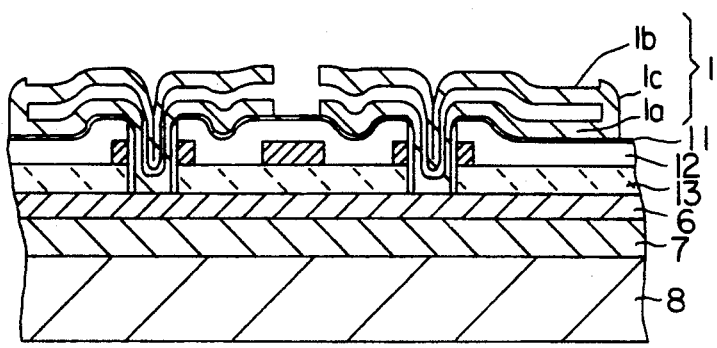

Thereafter, an NSG film 14 is deposited by CVD on the n-type doped polysilicon film 1a, as is shown in FIG. 3C. After that, another n-type doped polysilicon film 1b is deposited again by CVD on the NSG film 14. After the multilayer film consisting of the n-type doped polysilicon films 1a, 1b and the NSG film 14 is patterned into a prescribed form, a sidewall film formed from an n-type doped polysilicon film 1c is formed on the sidewall of the patterned multilayer film, thus interconnecting the upper and lower n-type doped polysilicon films 1a and 1b. Unwanted portions of the sidewall film formed from the n-type doped polysilicon film 1c are then selectively removed to expose portions of the NSG film 14, after which the NSG film 14 is removed by wet etching, thus completing the formation of a storage node 1 as is shown in FIG. 3D.

Figure 5:
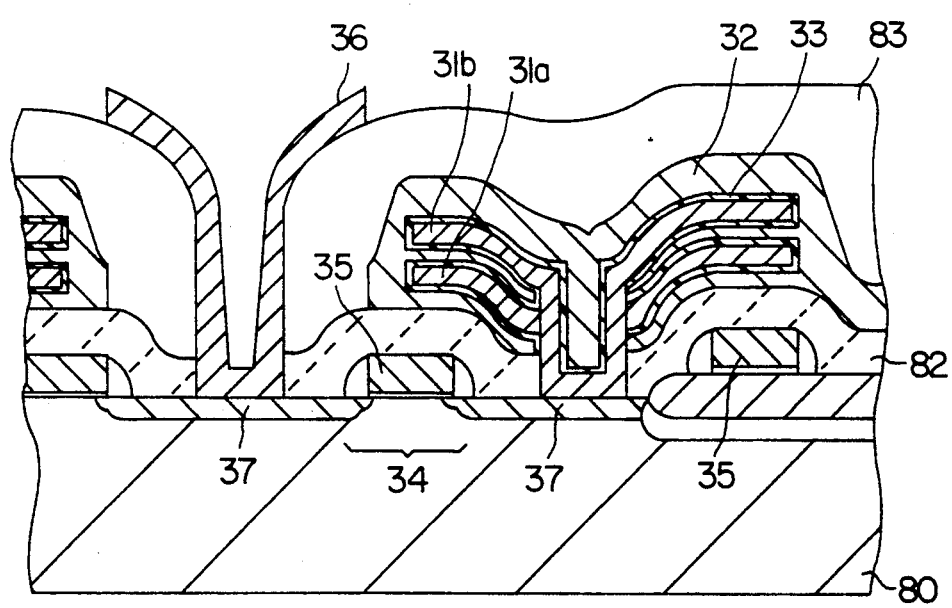
FIG. 5 is a cross-sectional view of a prior art thin-film semiconductor device.

In the prior art illustrated in FIG. 5, the upper and lower n-type doped polysilicon films are interconnected inside the throughhole. In the present embodiment, on the other hand, the interconnection between the upper and lower n-type doped polysilicon films 1a and 1b is made outside the throughhole; interconnecting the upper and lower n-type doped polysilicon films 1a and 1b inside the throughhole could hamper proper operation of the switching transistor within the throughhole.

If the surface area of the storage node 1 is to be further enlarged, the multilayer film should be constructed from three or more n-type doped polysilicon films with interposing insulating films (such as NSG films), the multilayer film then being patterned followed by the formation of a conductive sidewall film interconnecting the three or more n-type doped polysilicon films. After that, the dielectric film 3 and cell plate 2 are formed by conventional techniques, thus completing the fabrication of the thin-film semiconductor device shown in FIG. 1.

According to the above fabrication method, the vertical TFT 4 can be easily formed inside the thorough hole 10. In other words, the process is simplified because the thin-film semiconductor layer 4a and the n-type doped polysilicon layer 1a are formed integrally. Furthermore, since the gate insulating film 9 is formed not by oxidation, but by the deposition of the HTO film and the subsequent anisotropic etching, there occurs no oxidation on the surface of the bit line 6 exposed in the bottom of each throughhole 10. As a result, a good electrical contact is provided between the bit line 6 and the n-type doped polysilicon layer 1a deposited after the formation of the gate insulating film 9.

Figure 4:
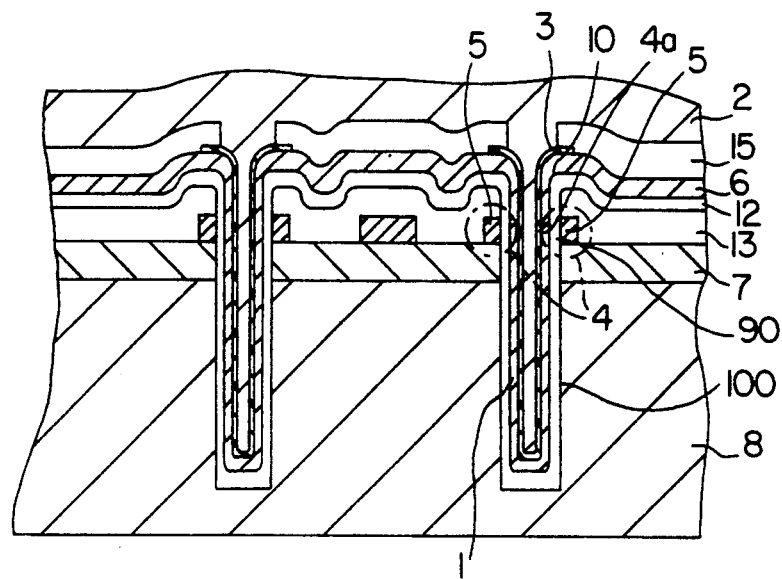
FIG. 4 is a cross-sectional view of another thin-film semiconductor device according to the present invention.

FIG. 4 shows a cross section of a memory cell of another embodiment according to the invention. This embodiment refers to a stacked trench DRAM. One of differences between this embodiment (first embodiment) and the embodiment illustrated in FIG. 1 (second embodiment) is that in this embodiment the storage node 1 is formed not above the vertical TFT 4 but within the trench underneath, the bit line 6 being formed above the vertical TFT 4.

As is shown in FIG. 4, the DRAM comprises a semiconductor substrate (singlecrystalline silicon substrate) 8, a trench 100 formed in the semiconductor substrate 8, an oxide film (LOCOS oxide film) 7 covering the surface of the semiconductor substrate 8, a plurality of word lines 5 formed on the oxide film 7, and a silicon oxide film 12 formed on top of the oxide film 7 and covering the word lines 5, with the silicon oxide film 12 including a plurality of throughholes 10. Each throughhole 10 penetrates the word lines 5 and the oxide film 7 and joins to the trench 100 in the semiconductor substrate 8 in integral fashion. The upper surface of the silicon oxide film 13 and the sidewall of the trench 100 are covered with a silicon oxide film 12, while an n-type doped polysilicon film is formed on top of the silicon oxide film 12. A portion of the silicon oxide film 12 serves as a gate insulating film 90 within the throughhole 10. On the other hand, the n-type doped polysilicon film acts as a storage node 1 within the trench 100, as a thin-film semiconductor layer 4a within the throughhole 10, and as a bit line 6 outside the throughhole 10. A dielectric film 3 for the capacitor is formed on the surface of the n-type doped polysilicon film. A cell plate 2 is formed on an silicon oxide film 15 so as to face the storage node 1 and separated by the dielectric film 3.

The switching transistor 4 of this embodiment includes the gate insulating film 90 (part of the silicon oxide film 12) formed on the sidewall of the throughhole 10, the thin-film semiconductor layer 4a (part of the n-type doped polysilicon film) formed on the gate insulating film 90, and the word line (gate electrode) 5 formed within the silicon oxide film 13. The word line 5, the gate insulating film 90, and the thin-film semiconductor layer 4a together form a lateral MOS structure (in the direction parallel to the principal plane of the semiconductor substrate). As described, according to this embodiment, the storage node 1 in the trench 100, the thin-film semiconductor layer 4a that acts as a channel of the TFT 4, and the bit line 6 are formed integrally from the same n-type doped polysilicon film. Therefore, the fabrication process is extremely simple.

According to the present invention, the channel length of the switching transistor is determined by the thickness of the gate electrode and is therefore not affected by the device miniaturization in lateral directions. Also, since the channel width of the switching transistor is determined by the inner circumferential length of the throughhole, the lateral dimensional increase of the throughhole resulting from increasing the channel width in one direction can be held down to ½ as compared with a conventional switching transistor formed on the surface of a semiconductor substrate. The structure of the thin-film transistor of the present invention is therefore suitable for device miniaturization.

In addition, the storage node of the storage capacitor is connected to the bit line through the channel layer of the switching TFT which is formed vertically in the throughhole. The storage node and the bit line are not electrically connected to the impurity diffusion region formed in the semiconductor substrate. Since this construction does not have p-n junctions with the semiconductor substrate, there is no need to consider p-n junction leakage, and further, the semiconductor device of this construction is free from soft errors resulting from discharging occurring within the substrate due to the presence of alpha particles.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A thin-film semiconductor device having a plurality of switching transistors, said thin-film semiconductor device comprising:
   a first insulating layer;
   a first conductive layer formed on said first insulating layer;
   a second insulating layer formed on said first insulating layer so as to cover said first conductive layer;
   a third insulating layer formed on said second insulating layer;
   a plurality of throughholes formed in said second and third insulating layers, each of said throughholes reaching said first conductive layer; and
   a second conductive layer formed on said third insulating layer,
   each of said switching transistors comprising:
      a gate insulating film formed on a sidewall of each of said throughholes;
      a thin-film semiconductor channel layer formed on said gate insulating film, said thin-film semiconductor channel layer interconnecting said first conductive layer to said second conductive layer; and
      a gate electrode formed on said second insulating layer, said gate electrode surrounding said gate insulating film.

2. A thin-film semiconductor device according to claim 1, wherein both said thin-film semiconductor channel layer and said second conductive layer are made of a polycrystalline silicon film.

3. A thin-film semiconductor device according to claim 1, wherein said device is a semiconductor memory device having a plurality of memory cells,
   each of said memory cells comprising one of said switching transistors and a storage capacitor,
   said storage capacitor comprising a storage node which includes a portion of said second conductive layer.

4. A thin-film semiconductor device according to claim 3, wherein said device comprises a plurality of bit lines for charging said storage node, said bit lines being made of said first conductive layer.

5. A thin-film semiconductor device having a switching transistor, said thin-film semiconductor device comprising:
   a semiconductor substrate;
   a first insulating layer formed on said semiconductor substrate;
   a second insulating layer formed on said first insulating layer;
   a plurality of throughholes formed in said first and second insulating layers, each of said throughholes reaching an inner portion of said semiconductor substrate;
   a third insulating film formed on said second insulating film and a side wall of each of said throughholes; and
   a conductive layer formed on said third insulating film;
   said switching transistor comprising:
      a gate insulating film formed on said side-wall of each of said throughholes, said gate insulating film being made of a portion of said third insulating film;
      a thin-film semiconductor channel layer formed on said gate insulating film, said thin-film semiconductor channel layer being made of a first portion of said conductive layer; and
      a gate electrode formed on said first insulating layer, said gate electrode surrounding said gate insulating film.

6. A thin-film semiconductor device according to claim 5, wherein both said thin-film semiconductor channel layer and said conductive layer are made of a polycrystalline silicon film.

7. A thin-film semiconductor device according to claim 5, wherein said device is a semiconductor memory device having a plurality of memory cells,
   each of said memory cells comprising one of said switching transistors and a storage capacitor,
   said storage capacitor comprising a storage node which is a second portion of said conductive layer, said second portion being at said inner portion of said semiconductor substrate.

8. A thin-film semiconductor device according to claim 7, wherein said device comprises a plurality of bit lines for charging said storage node, said bit lines being made of a third portion of said conductive layer.

* * * * *